United States Patent
Miller et al.

(10) Patent No.: US 7,446,990 B2
(45) Date of Patent: Nov. 4, 2008

(54) I/O CELL ESD SYSTEM

(75) Inventors: James W. Miller, Austin, TX (US); Michael G. Khazhinsky, Austin, TX (US); Michael Stockinger, Austin, TX (US); James C. Weldon, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 428 days.

(21) Appl. No.: 11/056,617

(22) Filed: Feb. 11, 2005

(65) Prior Publication Data

US 2006/0181823 A1    Aug. 17, 2006

(51) Int. Cl.
*H02H 9/00* (2006.01)

(52) U.S. Cl. ....................................................... 361/56

(58) Field of Classification Search .................. 361/56
See application file for complete search history.

(56) References Cited

U.S. PATENT DOCUMENTS

| | | | |
|---|---|---|---|
| 5,034,845 A | 7/1991 | Murakami | |
| 5,239,440 A | 8/1993 | Merrill | |
| 5,287,241 A | 2/1994 | Puar | |
| 5,311,391 A | 5/1994 | Dungan et al. | |
| 5,361,185 A | 11/1994 | Yu | |
| 5,440,162 A | 8/1995 | Worley et al. | |
| 5,508,649 A | 4/1996 | Shay | |
| 5,559,659 A | 9/1996 | Strauss | |
| 5,610,790 A | 3/1997 | Staab et al. | |
| 5,654,862 A | 8/1997 | Worley et al. | |
| 5,721,656 A | 2/1998 | Wu et al. | |
| 5,751,051 A | 5/1998 | Hayano | |
| 5,825,600 A | 10/1998 | Watt | |
| 5,907,464 A | 5/1999 | Maloney et al. | |
| 5,946,177 A | 8/1999 | Miller et al. | |
| 5,991,134 A | 11/1999 | Tan et al. | |
| 6,002,156 A | 12/1999 | Lin | |
| 6,198,138 B1 | 3/2001 | Hirota | |
| 6,222,710 B1 | 4/2001 | Yamaguchi | |
| 6,385,021 B1* | 5/2002 | Takeda et al. ............... 361/56 |

(Continued)

FOREIGN PATENT DOCUMENTS

EP         0 026 056 A1      4/1981

(Continued)

OTHER PUBLICATIONS

Stockinger et al., "Boosted and Distributed Rail Clamp Networks for ESD Protection in Advanced CMOS Technologies," EOS/ESD Symposium, 11 pgs. (2003).

(Continued)

*Primary Examiner*—Michael J Sherry
*Assistant Examiner*—Christopher J Clark
(74) *Attorney, Agent, or Firm*—David G. Dolezal (57) ABSTRACT

An ESD protection system for I/O cells of an integrated circuit. The I/O cells of a bank of cells include a first type of I/O cells having ESD trigger circuits and a second type of I/O cells having ESD clamp devices. In one embodiment, the ESD trigger circuits of the first type are located at the same area of an active circuitry floor plan as the area in the floor plan for the ESD clamp devices of the I/O cells of the second type.

22 Claims, 6 Drawing Sheets

U.S. PATENT DOCUMENTS

| | | | |
|---|---|---|---|
| 6,400,540 | B1 | 6/2002 | Chang |
| 6,576,958 | B2 | 6/2003 | Ker |
| 6,724,603 | B2 * | 4/2004 | Miller et al. ............... 361/111 |
| 6,970,336 | B2 * | 11/2005 | Stockinger et al. ............ 361/56 |

FOREIGN PATENT DOCUMENTS

| | | |
|---|---|---|
| EP | 0851552 A1 | 1/1998 |
| GB | 2 286 287 A | 8/1995 |
| WO | WO0227795 A2 | 4/2002 |

OTHER PUBLICATIONS

Ker et al., "ESD Protection Circuits with Novel Mos-Bounded Diode Structures," IEEE, pp. 533-536 (2002).

Ramirez-Angulo, J. et al., Programmable BICMOS Transconductor for Capacitor-Transconductor Filters, Electronics Letter, Jun. 18, 1992, pp. 1185-1187, vol. 28, No. 13, IEEE Stevenage, GB.

W. Anderson et al., "Cross-Referenced ESD Protection for Power Supplies," EOS/ESD Symp. Proceedings, 1998, pp. 2A.5.1-2A.5.10.

S. Dabral et al., "Core Clamps for Low Voltage Technologies," EOS/ESD Symp. Proceedings, 1994, pp. 3.6.1-3.6.9.

R. Merril and E. Issaq, "ESD Design Methodology," EOS/ESD Symp. Proceedings, 1993, pp. 5B.5.1-5.B.5.5.

C. Torres et al., "Modular, Portable, and Easily Simulated ESD Protection Networks for Advanced CMOS Technologies," EOS/ESD Symp. Proceedings, 2001.

E. Worley et al., "Sub-Micro Chip ESD Protection Schemes Which Avoid Avalanching Junctions," EOS/ESD Symp. Proceedings, 1995, pp. 1.2.1-1.2.8.

Stockinger et al., U.S. Appl. No. 10/315,796 entitled "Transient Detection Circuit," filed Dec. 10, 2002.

Stockinger et al., U.S. Appl. No. 10/914,442 entitled "Electrostatic Discharge Protection for an Integrated Circuit," filed Aug. 9, 2004.

* cited by examiner

I/O CELL ESD SYSTEM

BACKGROUND OF THE INVENTION

1. Field of the Invention

This invention relates in general to electrostatic discharge (ESD) and more specifically to ESD circuitry arrangement in an integrated circuit.

2. Description of the Related Art

An integrated circuit may be subjected to a damaging Electrostatic Discharge (ESD) event in the manufacturing process, during assembly and testing, or in the ultimate system application. In conventional integrated circuit (IC) ESD protection schemes, special clamp circuits are often used to shunt ESD current between the power supply rails and thereby protect internal elements from damage. A type of ESD clamp circuit, known as an active Metal Oxide Semiconductor Field Effect Transistor (MOSFET) clamp circuit, typically comprises two parts: a trigger circuit and a large MOSFET clamp transistor. The conduction of the clamp transistor is controlled by the trigger circuit. Active MOSFET clamp circuits may be employed in networks distributed along the power buses to provide robust and consistent ESD protection for all the Input/Output (I/O) pads in the IC. Multiple embodiments of such networks are shown in U.S. Pat. No. 6,385,021 entitled "Electrostatic Discharge (ESD) Protection Circuit" and in U.S. Pat. No. 6,724,603 entitled "Electrostatic Discharge Protection and Method of Operation." Both patents are assigned to the assignee hereof.

Figure 1:
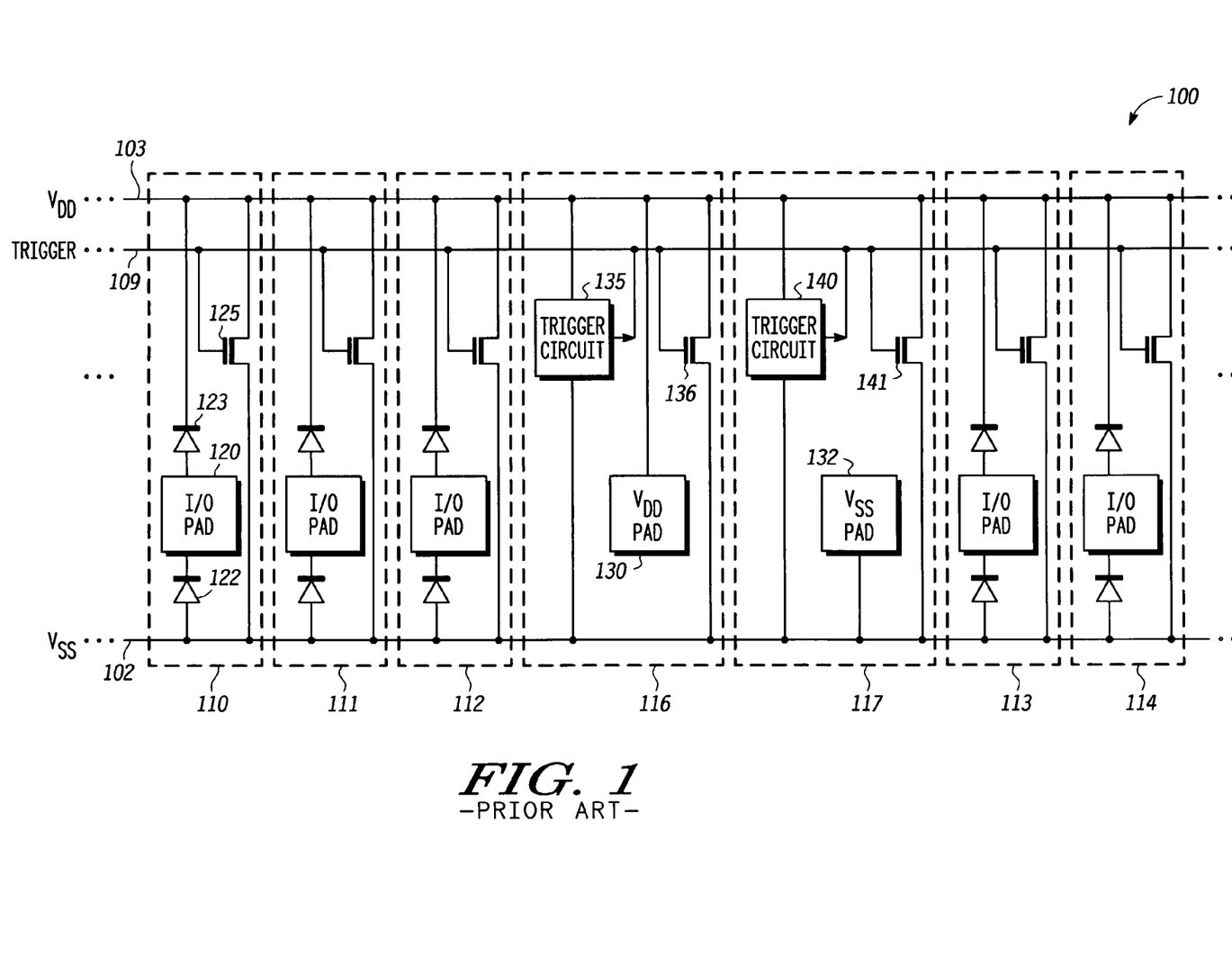
FIG. 1 is a circuit schematic illustrating a prior art ESD protection network.

FIG. 1 illustrates one such distributed ESD network 100 in an IC to protect multiple I/O pads in a bank of I/O cells. Five I/O cells 110-114 are shown in FIG. 1. However, the distributed network may encompass a larger bank of I/O cells around the IC periphery region as indicated by the dots placed to the left and right of the elements shown in FIG. 1. I/O cell 110 includes an external connection (I/O) pad 120 which is coupled between a $V_{SS}$ bus 102 and a $V_{DD}$ bus 103 via diodes 122 and 123, respectively. A clamp N-channel MOSFET (NMOSFET) 125 is connected between the $V_{SS}$ bus and the $V_{DD}$ bus. The gate of clamp NMOSFET 125 is connected to a trigger bus 109. Not shown in I/O cell 110, but assumed present is circuitry for normal (i.e. not ESD) I/O cell operation. I/O cells 111-114 are each identical to I/O cell 110. I/O cells are cells that include circuitry for conveying input signals, output signals, or both input signals and output signals.

In addition to I/O cells, the I/O ring around the periphery of an IC typically contains several power ($V_{DD}$) and ground ($V_{SS}$) cells. An example $V_{DD}$ cell 116 and $V_{SS}$ cell 117 are shown in FIG. 1. The $V_{DD}$ cell includes an external connection $V_{DD}$ pad 130 which connects to the on-chip $V_{DD}$ bus 103 while the $V_{SS}$ cell includes an external connection $V_{SS}$ pad 132 which connects to the on-chip $V_{SS}$ bus 102. The $V_{DD}$ cell contains a trigger circuit 135 which is powered by the $V_{DD}$ bus and the $V_{SS}$ bus and provides an output signal which drives trigger bus 109. The $V_{DD}$ cell also contains a clamp NMOSFET 136. The gate (a control terminal of a MOSFET) of clamp NMOSFET 136 is connected to the trigger bus. The $V_{SS}$ cell contains trigger circuit 140 and clamp NMOSFET 141, which are similar to the trigger circuit and clamp device in the $V_{DD}$ cell.

Integrated circuits are often most susceptible to damage during positive ESD events coupled onto an I/O pad referenced to grounded $V_{SS}$. The response of ESD network 100 to this event applied to I/O pad 120 in FIG. 1 is as follows. Diode 123 forward biases as the I/O pad voltage very quickly ramps above about 0.8V. This produces a rapid voltage increase over time (dV/dt or voltage slew rate) on the $V_{DD}$ bus 103. Trigger circuits 135 and 140 may be of a type of trigger circuit that contains a resistor-capacitor (RC) based voltage slew rate sensor tuned to respond only to very fast ESD-related transients, and a series of inverting buffer stages to drive the trigger circuit output. In response to an ESD dV/dt transient on the $V_{DD}$ bus, trigger circuits 135 and 140 drive trigger bus 109 to the $V_{DD}$ bus voltage. This turns on the multiple clamp NMOSFETs 125, 136, and 141 distributed in the I/O and power/ground cells, respectively. Once turned on, this cumulative network of clamp NMOSFETs acts as a low resistance shunt between the $V_{DD}$ bus and the $V_{SS}$ bus. The clamp NMOSFETs remain conductive for a period of time which is determined by an RC time constant of the trigger circuit. The trigger circuit should drive the clamp NMOSFETs for a period of time which exceeds the typical duration of an ESD event (e.g. 300-600 nanoseconds), yet avoid false triggering of the clamp NMOSFETs during normal ramp up of the $V_{DD}$ bus. With some examples, the $V_{DD}$ ramp-up during normal operation typically requires 1-5 microseconds.

In some IC designs, there are very few or no power or ground pads cells placed in the I/O ring. This is a problem with the ESD network approach of FIG. 1 because trigger circuits must typically be placed at least once for every 10-15 I/O cells in order to efficiently drive the clamp NMOSFETs distributed in the nearby I/O cells. For example, it would be difficult to ESD protect an unbroken, tightly abutted bank of 20 or more I/O cells placed without any intervening power or ground cells. In addition, advanced packaging options often eliminate power or ground cells in the I/O ring altogether. For example, in an IC designed for flip-chip packaging, off-chip connections to the power and ground buses are typically made directly down onto buses in the IC core region, without the need for any periphery power or ground cells in a bank of I/O cells. Thus there is a need for a new ESD network approach especially which can fully protect a large bank of tightly abutted I/O cells without any intervening power or ground cells.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

The following sets forth a detailed description of a mode for carrying out the invention. The description is intended to be illustrative of the invention and should not be taken to be limiting.

In one embodiment of the present invention, an ESD trigger circuit is located in every fourth or fifth I/O cell of an I/O cell bank while the remaining I/O cells of the bank include an ESD clamp NMOSFET (or another type of ESD clamp device), wherein the ESD trigger circuits drive the NMOSFETs in the neighboring I/O cells. With some embodiments, a trigger bus is used to couple the output of the trigger circuit in a first type of I/O cells (i.e. those with trigger circuits) to the gates of the clamp NMOSFETs (or other type of ESD clamp devices) distributed in a second type of I/O cells (i.e. those with clamp NMOSFETs). In some embodiments, both types of I/O cells may be identical in all other respects. In some embodiments, an ESD trigger circuit in one I/O cell of an I/O cell bank may drive at least the two clamp NMOSFETs in adjacent I/O cells. At least some embodiments implement an ESD protection network such that a large bank of tightly abutted I/O cells may be protected without any intervening power or ground cells. Power and ground cells have been utilized for trigger cell placement in prior art ESD protection networks.

Figure 2:
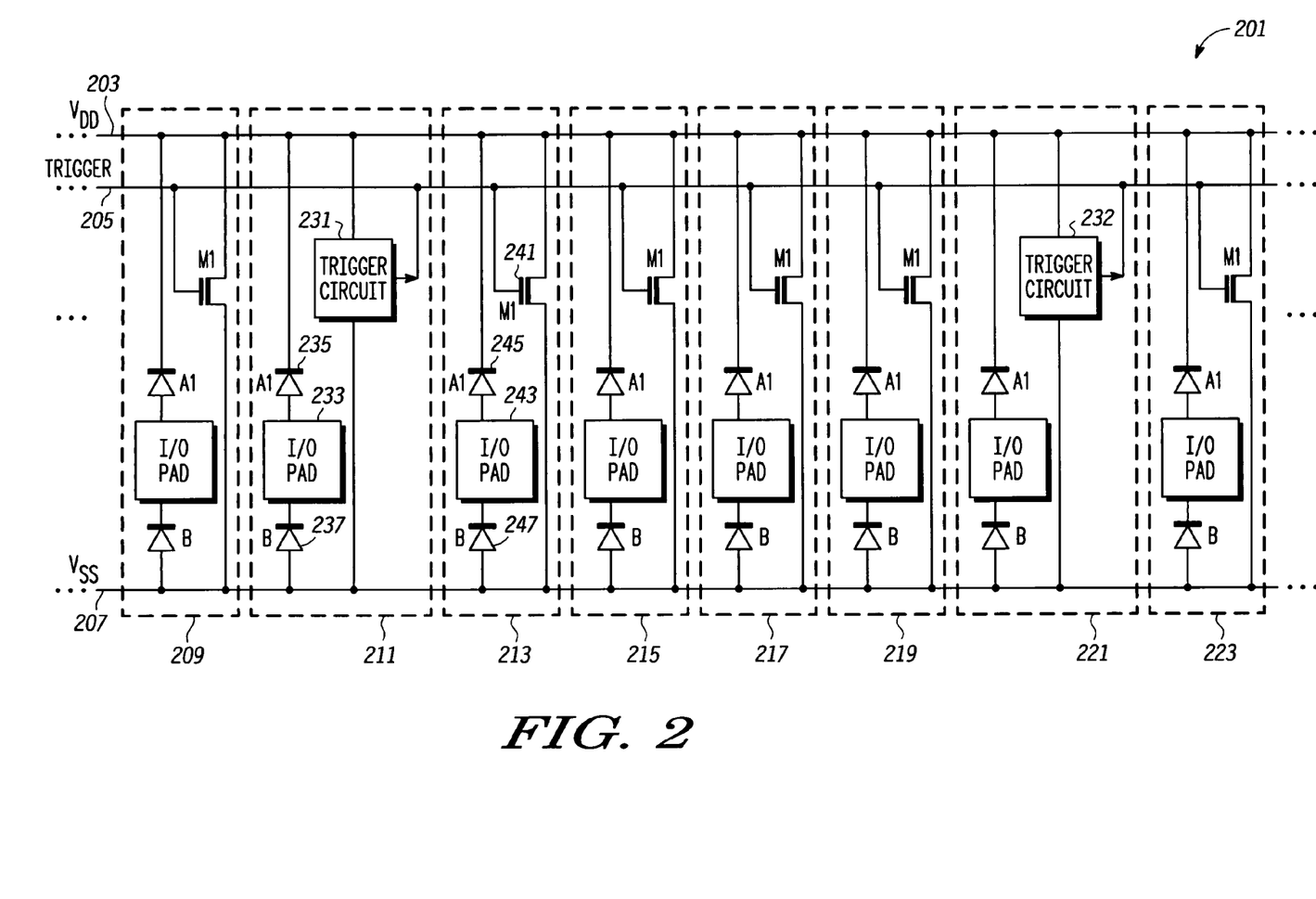
FIG. 2 is a circuit schematic illustrating one embodiment of an ESD protection network according to the present invention.

FIG. 2 illustrates an ESD protection network in a bank of I/O cells in an integrated circuit according to one embodiment of the present invention. Each I/O cell may be described in both a schematic sense, as shown in FIG. 2, and in a physical layout sense (e.g. see FIG. 5), occupying a specific area in the IC periphery. As shown in the embodiment of FIG. 2, bank 201 includes I/O cells having an I/O pad and ESD elements. Not shown in the I/O cells of FIG. 2, but assumed present, is the I/O circuitry desired to be protected from ESD damage, such as for example P-channel MOSFET (PMOSFET) and N-channel MOSFET (NMOSFET) output drivers, input buffers, and other circuit components typically included for normal I/O operation. In one embodiment, bank 201 is part of a larger bank of I/O cells around the IC periphery region as indicated by the dots placed to the left and right of the elements shown in FIG. 2. The term "I/O cells" encompasses input-only cells, output-only cells, or input and output cells. The term "I/O pads" encompasses pads that convey only input signals, only output signals, or both input signals and output signals.

Each I/O pad (e.g. 243) is coupled to a $V_{DD}$ power supply bus 203 via a diode (e.g. diode 245) designated as diode A1 for each cell, and coupled to a $V_{SS}$ power supply bus 207 via a diode designated as diode B (e.g. diode 247). In other embodiments, each I/O cell may include multiple pads such as two I/O pads or an I/O pad and a power pad (a voltage or ground pad).

Bank 201 includes two types of I/O cells. The first type of I/O cells (e.g. cells 211, 221), hereafter referred to as trigger I/O cells, include an ESD trigger circuit (e.g. 231, 232). The second type of I/O cells (e.g. cells 209, 213, 215, 217, 219, and 223), hereafter referred to as clamp I/O cells, include an ESD clamp device (designated as M1), which in the embodiment shown is implemented as an NMOSFET (e.g. NMOSFET 241). Other embodiments may include other types of ESD clamp devices e.g. a PMOSFET, a bipolar transistor, or a semiconductor controlled rectifier (SCR).

Each ESD trigger circuit (231 and 232) in the trigger I/O cells (211 and 221) includes circuitry for detecting an ESD event. In one embodiment, an ESD event is defined as an event having a rapid rise time characteristic of e.g. 100 picoseconds to 60 nanoseconds. However, an ESD event may be defined to have other rise times or by other characteristics in other embodiments. In response to detecting an ESD event, the trigger circuit drives the trigger bus 205 to approximately the voltage level of $V_{DD}$ bus 203 to make conductive the M1 clamp devices of the clamp I/O cells (209, 213, 215, 217, 219, and 223) to discharge the current of the ESD event from $V_{DD}$ bus 203 to $V_{SS}$ bus 207.

In one example showing the operation of the ESD protection network in bank 201, a positive ESD event is coupled to I/O pad 233 with respect to grounded $V_{SS}$ bus 207. This produces via forward biased A1 diode 235 a voltage with a large slew rate (dV/dt) on $V_{DD}$ bus 203. Trigger circuits 231 and 232 sense the rapid dV/dt on $V_{DD}$ bus 203, and in response drive trigger bus 205 to a voltage level approximately equal to the voltage level of the $V_{DD}$ bus 203, which makes conductive each of the M1 clamp NMOSFETs. In this manner the $V_{DD}$ bus 203 is discharged to ground via drain to source conduction of the multiple M1 clamp NMOSFETs which operate in parallel. The ESD network shown in FIG. 2 discharges other types of ESD events as well.

One advantage of the embodiment shown in FIG. 2 is that all elements of the ESD network for protecting I/O cell bank 201 reside within the I/O cells themselves. Note that no power or ground cells are needed for ESD protection in the embodiment of FIG. 2. This may be, in some embodiments, a significant improvement over prior art distributed rail clamp networks.

FIG. 2 shows eight I/O cells in bank 201. However, bank 201 may include more of both trigger and clamp I/O cells, located adjacent to cell 209 and cell 223. In one embodiment, the trigger I/O cells are placed once for about every four or five clamp I/O cells. In other embodiments this placement frequency may vary. In some embodiments, the placement frequency may be in a range of one trigger I/O cell for every one to twenty clamp I/O cells. In one embodiment, bank 201 may form a closed ring around the entire IC, with hundreds, or even thousands of I/O cells. In this case, $V_{DD}$ bus 203 and $V_{SS}$ bus 207 may also form unbroken rings around the IC periphery. In other embodiments, an IC may contain multiple banks of I/O cells similar to FIG. 2 or having other designs. Each of these multiple I/O banks may utilize a same or different $V_{DD}$ bus and $V_{SS}$ bus. In some embodiments, I/O banks are located only around the perimeter of the integrated circuit. In other embodiments, I/O banks may be located partially or exclusively within the IC core region.

Figure 3:
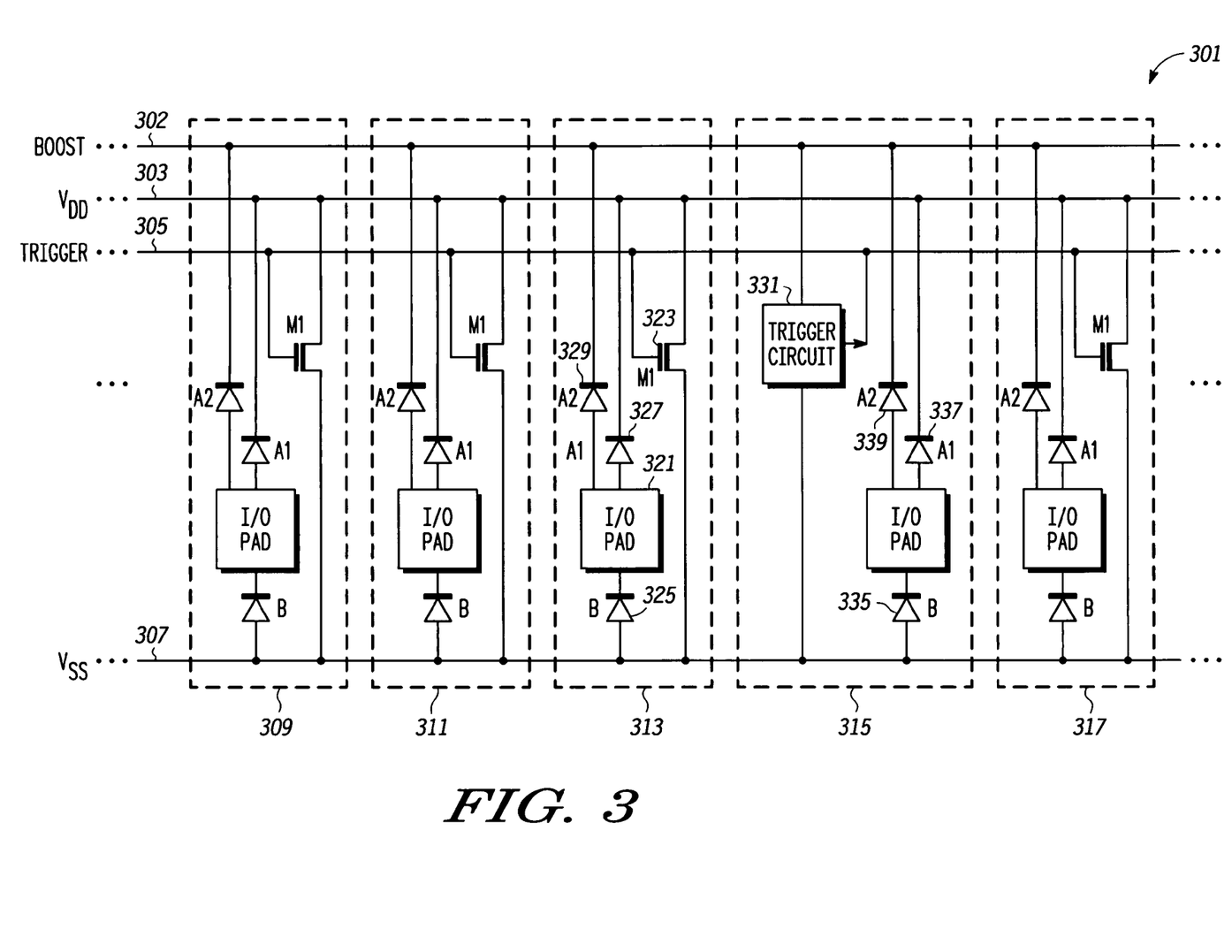
FIG. 3 is a circuit schematic illustrating another embodiment of an ESD protection network according to the present invention.

FIG. 3 illustrates another embodiment of a bank of I/O cells 301 of an integrated circuit according to the present invention. In the embodiment of FIG. 3, the ESD protection network includes an additional boost bus 302. In contrast to the network of FIG. 2, boost bus 302, rather than the $V_{DD}$ bus 303, powers the trigger circuits (e.g. trigger circuit 331 in I/O cell 315). Each I/O pad of bank 301 is coupled to boost bus 302 via an A2 diode (e.g. diode 329 in I/O cell 313).

A feature of this network is that the ESD trigger circuits are now coupled to any stressed I/O pad via boost bus 302 which is separate from the high ESD current $V_{DD}$ bus 303. During a positive ESD event applied, for example, to I/O pad 321 with respect to $V_{SS}$ bus 307 grounded, the primary (high current) ESD path is through forward biased A1 diode 327 to the $V_{DD}$ bus, then through each of the M1 clamps to the $V_{SS}$ bus 307. Significant IR voltage drops occur along this path due to the high ESD current (e.g. 2-4 Amperes or greater), such that the M1 clamp NMOSFET drain to source voltage (Vds) is often one half or less of the voltage on the stressed I/O pad 321. A secondary (low current) ESD path is through forward biased A2 diode 329 to the boost bus 302, which powers the trigger circuits. The trigger circuits then detect a dV/dt transient on the boost bus 302 and drive the M1 clamp gates to approximately the boost bus voltage via the trigger bus 305. Driving the M1 clamp gates requires very little current. Therefore, due to the very small ESD current routed along the boost and trigger buses, there is a diode voltage drop (~0.8V) due to the A2 diode, but very little IR voltage drop between the stressed I/O pad 321 and the gates of the M1 clamps. Indeed the boost and trigger buses may be made quite narrow and resistive without imparting any significant IR drop during ESD events. Therefore, due to the fact that the trigger circuits are coupled to the stressed I/O pad via the low IR drop boost bus 302, rather than the high IR drop $V_{DD}$ bus 303, the gate to source voltage (Vgs) for the multiple M1 clamps is typically greater than the drain to source voltage (Vds). The on-resistance of a clamp NMOSFET is approximately inversely proportional to Vgs under these bias conditions. This helps to maximize the distributed rail clamp network performance and minimize the layout area required to implement robust ESD protection circuits of a given performance level. The "boosted" ESD network illustrated in FIG. 3 may provide enhanced ESD protection as compared to the non-boosted circuit shown in FIG. 2. A more detailed explanation and examples of boosted ESD protection networks may be found in U.S. Pat. No. 6,724,603.

As in the ESD network of FIG. 2, bank 301 comprises I/O cells of both types e.g. trigger I/O cells and clamp I/O cells. A single trigger I/O cell 315, with trigger circuit 331 is shown in FIG. 3. Also shown are multiple clamp I/O cells (e.g. 309, 311, 313, 317) with ESD clamp devices (implemented with NMOSFETs in the embodiment shown) designated M1 (e.g. 323). FIG. 3 shows five I/O cells in bank 301. Bank 301 may contain additional I/O cells of both types as indicated by the three dots shown to the left of I/O cell 309 and to the right of I/O cell 317. In the ESD network of FIG. 3, every fourth or fifth I/O cell in the I/O bank contains a trigger circuit to drive the clamp NMOSFETs in the remaining nearby clamp I/O cells. However, in other embodiments the frequency of placement of trigger I/O cells among clamp I/O cells may vary. Bank 301 may form a closed ring around the entire IC, or may form one of multiple I/O banks in the IC. Note that no power or ground cells are shown in FIG. 3. All elements of the ESD network for protecting the I/O cell bank 301 reside within the I/O cells themselves.

In one embodiment, multiple ESD trigger circuits may operate in parallel to drive a single trigger bus (e.g. 305). In another embodiment, the trigger bus may be partitioned such that a single trigger circuit (e.g. 331) drives the trigger bus partition. In this embodiment, each ESD clamp device would be driven by a single trigger circuit. In other embodiments, a boost bus (e.g. 302) may be partitioned as well.

An advantage of the ESD networks illustrated in FIGS. 2 and 3 is that they may enable robust ESD protection for IC designs without any ESD-specific rules for power or ground cell placement frequency within an I/O bank. This may greatly increase the design options and flexibility for the I/O ring designer. In one embodiment, power or ground cells may be placed very infrequently in the I/O ring (i.e. once for every 20 I/O cells or more). In another embodiment, the I/O ring may not contain any power or ground cells, as may be the case for some integrated circuits bound for flip-chip packages. With no requirements for ESD elements other than those found in the trigger and clamp I/O cells, the full active MOSFET rail clamp ESD protection circuitry for an I/O cell bank may be contained wholly within the physical extent of the I/O cells within the bank.

Figure 4:
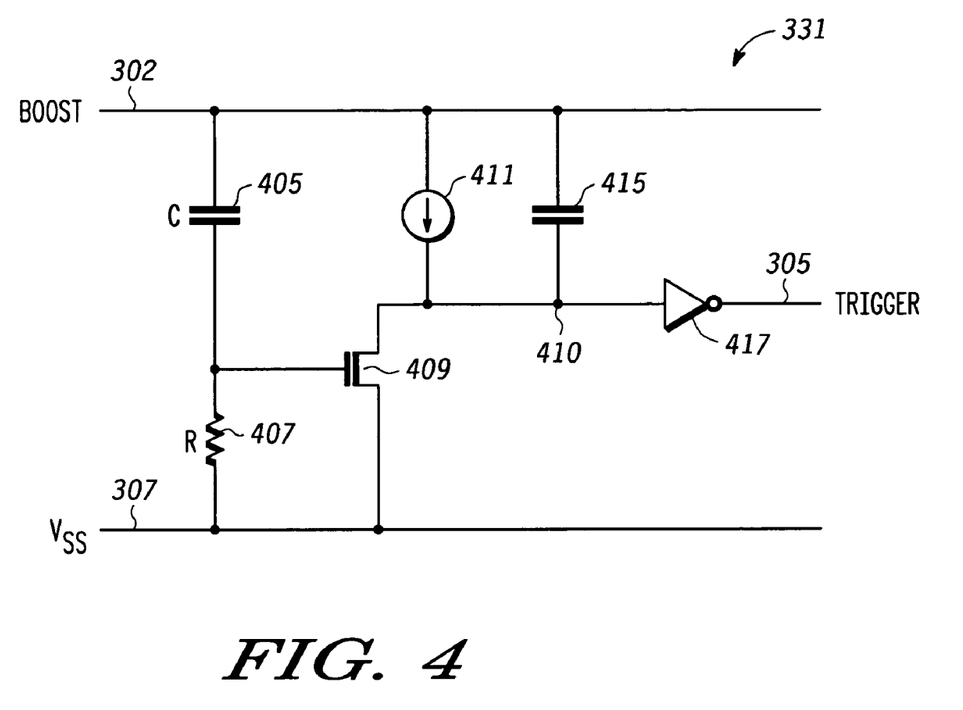
FIG. 4 is a schematic of one embodiment of an ESD trigger circuit according to the present invention.

FIG. 4 is a circuit diagram of one embodiment of ESD trigger circuit 331. Trigger circuit 331 includes an RC circuit of capacitive element 405 and resistive element 407 for detecting a dV/dt transient on the boost bus 302. If the voltage rise time is sufficiently fast (e.g. 60 ns or less), transistor 409 is turned on long enough to pull node 410 down to the voltage of the $V_{SS}$ bus 307 (logic level low). Inverter 417 then outputs a voltage about equal to the boost bus 302 (logical level high) onto trigger bus 305 to turn on the M1 clamp devices (e.g. 323 in FIG. 3). Current source 411 and capacitive element 415 act as a delay-on circuit for holding the input of inverter 417 low for a period of time appropriate to fully discharge the ESD event (e.g. typically 300-600 ns for some embodiments).

In some embodiments, trigger circuit 331 may also include a $V_{DD}$ boost circuit (not shown in FIG. 4). A $V_{DD}$ boost circuit may be used to increase the boost bus voltage to the voltage applied to the $V_{DD}$ bus during a positive ESD event applied directly to the $V_{DD}$ bus. The boost circuit may include a voltage comparator circuit and if the voltage of the $V_{DD}$ bus exceeds the boost bus during an ESD event, the boost circuit pulls the boost bus up to the voltage of the $V_{DD}$ bus.

FIG. 4 shows one type of ESD trigger circuit that may be implemented in the ESD protection network of FIG. 3. This trigger circuit may be used for the non-boosted network of FIG. 2 by powering the trigger circuit with the $V_{DD}$ bus rather than the boost bus. Other embodiments may implement other types of ESD trigger circuits e.g. including other types of RC or transient detector trigger circuits or voltage threshold detector trigger circuits.

Figure 5:
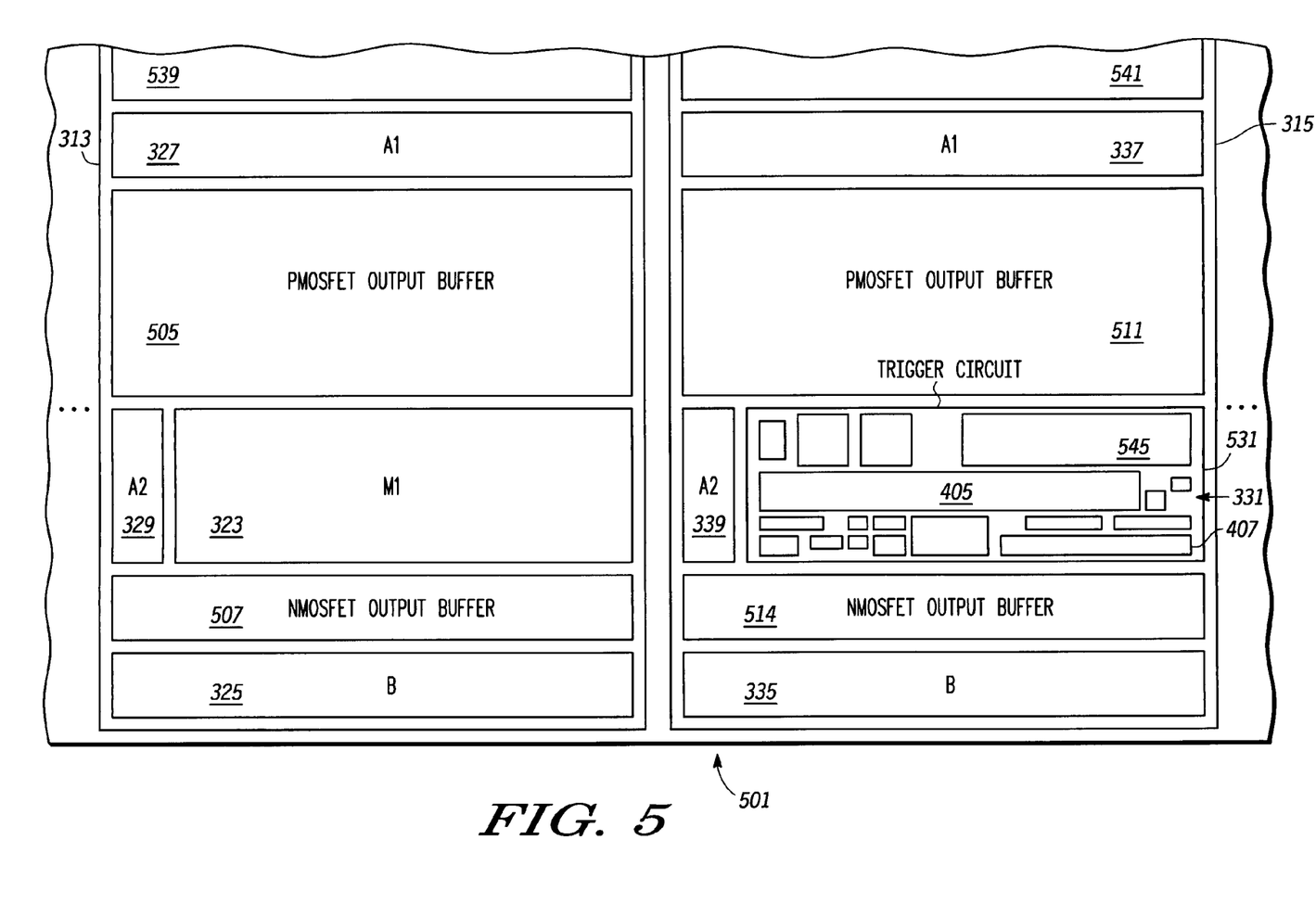
FIG. 5 is a partial top view of one embodiment of active circuitry of an integrated circuit according to the present invention.

FIG. 5 is a partial top view of the physical layout of active circuitry (e.g. transistors, capacitors, resistors, diodes) of two I/O cells within an I/O cell bank (e.g. 301) of an integrated circuit 501. In one embodiment, the active circuitry includes devices having portions implemented in a semiconductor material e.g. of the substrate as with bulk semiconductor (e.g. silicon, SiGe, GaAs) devices. In another embodiment, the active devices may be implemented in Silicon on Insulator (SOI) structures. FIG. 5 shows portions of the physical layout of the active area for two I/O cells: clamp I/O cell 313 and trigger I/O cell 315. It is assumed that other I/O cells (of both types) may be found to the right and left of the cells shown in FIG. 5. In one embodiment, I/O cells 313 and 315 are located in the periphery I/O ring of an IC.

As shown in FIG. 5, the active circuitry physical layouts for cells 313 and 315 are each laid out as per an active circuitry floor plan, which is similar for both types of I/O cells. For example, the A1 diodes (327 and 337) of both cells are located in the same area of each floor plan. Also, the B diodes (e.g. 325 and 335), the A2 diodes (329 and 339), the NMOSFET buffers (buffer 507 of cell 313 and buffer 514 of cell 315) and PMOSFET buffers (buffer 505 of cell 313 and buffer 511 of cell 315) are located in the same areas of the floor plans. Also, cell 313 includes additional I/O circuitry 539 and cell 315 includes additional 110 circuitry 541, which are partially shown in FIG. 5, and are located in the same area of the floor plans.

In the embodiment shown, clamp I/O cell 313 includes M1 clamp device 323 located between NMOS output buffer 507 and PMOS output buffer 505. For other clamp I/O cells of bank 301 (e.g. cells 309, 311 and 317), the M1 clamp device is located in the same area of the floor plan as in cell 313.

In the embodiment shown, trigger circuit 331 of trigger I/O cell 315 is located in area 531 between NMOS output buffer 514 and PMOS output buffer 511. Area 531 resides in the same area of the active circuitry floor plan of trigger I/O cell 315 as M1 clamp device 323 resides within clamp I/O cell 313. Area 531 is shown in FIG. 5 including several active devices (illustrated as rectangles) including, for example, capacitive element 405 and resistive element 407. Device 545 is a PMOSFET pull up transistor in inverter 417. Other trigger I/O cells of bank 301, if present, also include an ESD trigger circuit located in the same area (e.g. 531) of the floor plan as in cell 315. Area 531 may include other devices in other embodiments.

In the embodiment of FIG. 5, M1 clamp device 323 in clamp I/O cell 313, and trigger circuit 331 in area 531 of trigger I/O cell 315, are of about the same physical size and occupy the same physical layout area of the floor plan of their respective I/O cells. For this reason, a design layout of a single base I/O cell floor plan may be created with nothing placed in this clamp/trigger circuit area. A clamp I/O cell or a trigger I/O cell can be designed from this base I/O cell floor plan by dropping in either an M1 clamp device (e.g. 323) or a trigger circuit (e.g. 331). A design for an I/O bank (e.g. I/O bank 301 in FIG. 3) may then be easily created by placing clamp I/O cells or trigger I/O cells as needed. This approach, utilizing a base I/O cell floor plan with interchangeable M1 clamp or trigger circuit provides a very efficient means of implementing the ESD network in a bank of I/O cells.

In some embodiments, the floor plan of the base I/O cell is configured so that all the connections to the boost bus 302, $V_{DD}$ bus 303, trigger bus 305 and $V_{SS}$ bus 307 may easily be made within the area to be occupied by either the M1 clamp device or the trigger circuit.

In some embodiments, trigger circuit 331 and M1 clamp device 323 occupy about the same layout area of the floor plans of the I/O cells. Otherwise, some area may be wasted in the I/O cell with the smaller of the two ESD elements, since the base I/O cell floor plan must accommodate the larger of the two ESD elements. Therefore, this equal area consideration may be a constraint when running ESD network circuit simulations in e.g. SPICE to determine the size of the M1 clamp devices, the size of the trigger circuit elements, and the optimum trigger circuit placement frequency (trigger I/O cell placement frequency) in a bank of I/O cells.

Referring again to FIG. 5, other I/O cells of other banks of an integrated circuit may have other physical layouts with different floor plans. For example, the layout of FIG. 5 shows the PMOSFET buffers (e.g. 505) and NMOSFET buffers (e.g. 507) intermixed with ESD circuitry (e.g. M1 clamp device, A1 diode, A2 diode, B diode, and trigger circuitry). However, in other embodiments, these areas may be separated from the ESD devices, or intermixed in other arrangements. Also in other embodiments, the ESD devices may be intermixed with other I/O circuitry (e.g. 539 and 541) of an I/O cell instead of being separate as shown in FIG. 5. Also in other embodiments, the floor plan of an I/O cell may have other forms than that shown in FIG. 5. For example, an I/O cell configured as input only need not include PMOSFET and NMOSFET output buffers. Other embodiments of I/O cells may include other circuitry.

Figure 6:
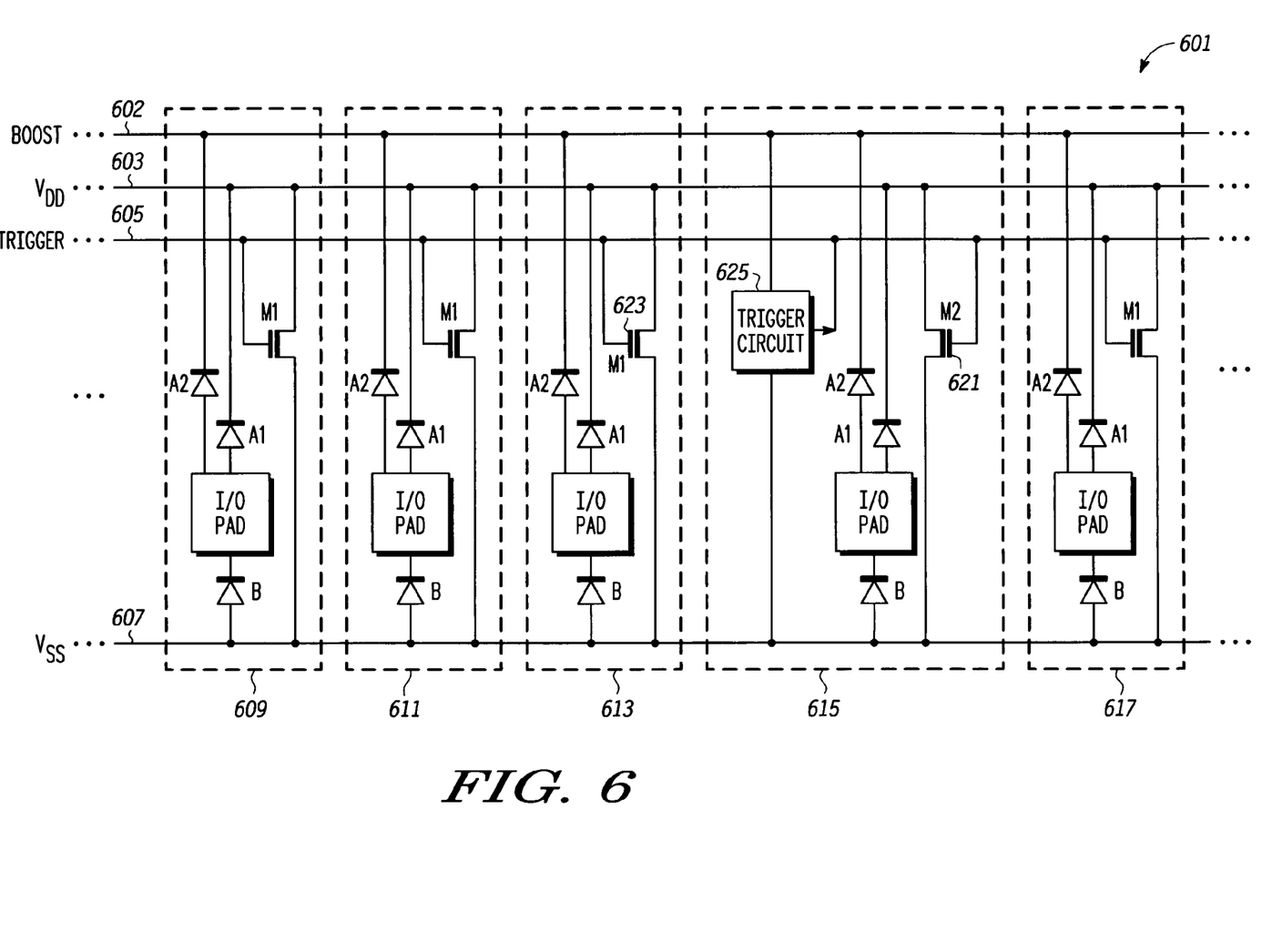
FIG. 6 is a circuit schematic illustrating another embodiment of an ESD protection network according to the present invention The use of the same reference symbols in different drawings indicates identical items unless otherwise noted. The figures are not necessarily drawn to scale.

FIG. 6 is a circuit diagram of another embodiment of a bank of I/O cells 601 of an integrated circuit according to the present invention. The ESD protection network of FIG. 6 is similar to the ESD protection network of FIG. 3 except that the first type of I/O cells (e.g. 615) with ESD trigger circuits (e.g. 625) also includes a clamp device, designated as M2 clamp device (e.g. 621) and implemented with an NMOSFET. The second type of I/O cells (e.g. 613) are the same as before, with M1 clamp devices (e.g. 623). In one embodiment, the M2 clamp device occupies a smaller physical layout area of the I/O cell than that of the M1 clamp devices.

The embodiment of FIG. 6 is most efficient when the combined physical layout area of the trigger circuit 625 and M2 clamp device 621 is about equal to the physical layout area of the M1 clamp device (e.g. 623). Similar to the configuration described in reference to FIG. 5, a base I/O cell floor plan may be created which allows for interchangeable placement of either the combined trigger circuit and M2 clamp device (to make the first type of I/O cell) as e.g. in area 531 or the M1 clamp device (to make the second type of I/O cell).

For some IC applications, including an M2 clamp device and trigger circuit in the first type of I/O cell, and an M1 clamp device in the second type of I/O cell may advantageously provide for greater discharge capability for the entire network while minimizing the physical layout area of the combined ESD elements.

In one embodiment, an integrated circuit includes a plurality of I/O cells. Each I/O cell of the plurality of I/O cells is one of a first type or of a second type. Each I/O cell of the first type includes an ESD trigger circuit for detecting an ESD event. Each I/O cell of the second type includes an ESD clamp device for providing a discharge path for discharging current from an ESD event in response to a detection of an ESD event by an ESD trigger circuit of an I/O cell of the first type. Each I/O cell of the second type does not include an ESD trigger circuit to which the ESD clamp device of the I/O cell is responsive.

In one embodiment, an integrated circuit includes a plurality of I/O cells. Each has an active circuitry physical layout as per an active circuitry floor plan. Each of a first subset of I/O cells of the plurality of I/O cells includes an ESD clamp device at a same designated area of its active circuitry floor plan. Each of a second subset of I/O cells of the plurality of I/O cells includes circuitry for an ESD trigger circuit at the same designated area of its active circuitry floor plan.

In one embodiment, an integrated circuit includes a plurality of I/O cells located in a bank of cells. Each I/O cell of the plurality of I/O cells includes an I/O pad and each I/O cell of the plurality of I/O cells is one of a first type or of a second type. Each I/O cell of the plurality of I/O cells has an active circuitry physical layout as per an active circuitry floor plan. Each I/O cell of the first type includes an ESD trigger circuit for detecting an ESD event. For each I/O cell of the first type, circuitry of the ESD trigger circuit is at a same designated area of its active circuitry floor plan. Each I/O cell of the second type includes an ESD clamp device for providing a discharge path for discharging current from an ESD event in response to a detection of an ESD event by an ESD trigger circuit of an I/O cell of the first type. Each I/O cell of the second type does not include an ESD trigger circuit to which the ESD clamp device of the I/O cell is responsive. For each I/O cell of the second type, the ESD clamp device is located at the same designated area of its active circuitry floor plan.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. An integrated circuit comprising:
   a plurality of I/O cells, each I/O cell of the plurality of I/O cells is one of a first type or of a second type, wherein:
   each I/O cell of the first type includes an ESD trigger circuit for detecting an ESD event;
   each I/O cell of the second type includes an ESD clamp device for providing a discharge path for discharging current from an ESD event in response to a detection of an ESD event by an ESD trigger circuit of an I/O cell of the first type, each I/O cell of the second type does not include an ESD trigger circuit to which the ESD clamp device of the I/O cell is responsive;

wherein:
each I/O cell of the first type has an active circuitry physical layout as per a first active circuitry floor plan, wherein for each I/O cell of the first type, circuitry of the ESD trigger circuit is located at a first designated area of the first active circuitry floor plan;

each I/O cell of the second type has an active circuitry physical layout as per a second active circuitry floor plan, the first active circuit floor plan being of a same size and shape as the second active circuitry floor plan, wherein for each I/O cell of the second type, the ESD clamp device occupies a second designated area of the second active circuitry floor plan;

wherein a location of the first designated area in the first active circuitry floor plan is a location that corresponds to a location of the second designated area in the second active circuitry floor plan.

2. The integrated circuit of claim 1 wherein the ESD clamp device of each I/O cell of the second type includes a transistor including a control terminal coupled to a bus, each ESD trigger circuit of an I/O cell of the first type includes an output coupled to the bus.

3. The integrated circuit of claim 2 wherein the ESD trigger circuits of the I/O cells of the first type operate in parallel to drive the bus to make conductive the ESD clamp devices of the I/O cells of the second type in response to a detection of an ESD event.

4. The integrated circuit of claim 1 wherein the plurality of I/O cells are implemented in a bank of I/O cells, wherein a ratio of a number of I/O cells of the second type in the bank to a number of I/O cells of the first type in the bank is N where N is 1 or greater.

5. The integrated circuit of claim 1 wherein each I/O cell of the first type includes an ESD clamp device for providing a discharge path for discharging current from an ESD event in response to a detection of an ESD event by an ESD trigger circuit.

6. The integrated circuit of claim 5 wherein each ESD clamp device of I/O cells of the first type has a smaller active circuitry physical layout area than each ESD clamp device of the I/O cells of the second type.

7. An integrated circuit comprising:
a plurality of I/O cells including a first subset of I/O cells and a second subset of I/O cells;
wherein each of the first subset of I/O cells having an active circuitry physical layout as per a first active circuitry floor plan; wherein each of the first subset of I/O cells includes an ESD clamp device occupying a first designated area of the first active circuitry floor plan;
wherein each of the second subset of I/O cells having an active circuitry physical layout as per a second active circuitry floor plan, wherein each of the second subset of I/O cells includes circuitry for an ESD trigger circuit at a second designated area of the second active circuitry floor plan;
wherein a location of the first designated area in the first active circuitry floor plan is a location that corresponds to a location of the second designated area in the second active circuitry floor plan.

8. The integrated circuit of claim 7 wherein:
the ESD clamp devices of the first subset are made conductive to discharge current from an ESD event in response to a detected ESD event by an ESD trigger circuit of the second subset.

9. The integrated circuit of claim 7 wherein the plurality of I/O cells are implemented in a cell bank of the integrated circuit.

10. The integrated circuit of claim 7 wherein each of the plurality of I/O cells include an I/O pad.

11. The integrated circuit of claim 10 wherein for each I/O cell of the plurality of I/O cells, the I/O pad is coupled to a first bus via a first diode of the I/O cell and a second bus via a second diode of the I/O cell;

wherein for the first subset of I/O cells, the first diode is located in a third designated area of the first active circuitry floor plan, and the second diode is located in a fourth designated area of the first active circuitry floor plan;

wherein for the second subset of I/O cells, the first diode is located in a fifth designated area of the second active circuitry floor plan, and the second diode is located in a sixth designated area of the second active circuitry floor plan;

wherein a location of the third designated area in the first active circuitry floor plan is a location that corresponds to a location of the fifth designated area in the second active circuitry floor plan;

wherein a location of the fourth designated area in the first active circuitry floor plan is a location that corresponds to a location of the sixth designated area in the second active circuitry floor plan.

12. The integrated circuit of claim 11 wherein:
for each I/O cell of the plurality of I/O cells, the I/O pad is coupled to a third bus via a third diode of the I/O cell;
for the first subset of I/O cells, the third diode is located in a seventh designated area of the first active circuitry floor plan;
for the second subset of I/O cells, the third diode is located in an eighth designated area of the second active circuitry floor plan;
a location of the seventh designated area in the first active circuitry floor plan is a location that corresponds to a location of the eighth designated area in the second active circuitry floor plan
for each I/O cell of the second subset, the ESD trigger circuit detects an ESD event with respect to the first bus and the third bus.

13. The integrated circuit of claim 7 wherein each I/O cell of the second subset are separated from each other by at least one I/O cell of the first subset.

14. The integrated circuit of claim 7 wherein each I/O cell of the second subset are separated from each other by at least two I/O cells of the first subset.

15. The integrated circuit of claim 7 wherein each I/O cell of the second subset includes an ESD clamp device at the second designated area of its active circuitry floor plan.

16. The integrated circuit of claim 15 wherein the ESD clamp device of the second subset is smaller in area than the ESD clamp device of the first subset.

17. The integrated circuit of claim 7 wherein the plurality of I/O cells are implemented in a bank of cells, wherein a ratio of a number of I/O cells of the first subset in the bank to a number of I/O cells of the second subset in the bank is N where N is 1 or greater.

18. The integrated circuit of claim 17 where N is 4 or greater.

19. The integrated circuit of claim 7 wherein:
the plurality of I/O cells are implemented in a bank of cells; all of the active circuitry for ESD protection of the I/O cells of the bank is contained within the bank of cells.

20. The integrated circuit of claim 7 wherein the plurality of I/O cells are implemented in a bank of cells, wherein no power cells and no ground cells are located within the bank of cells.

21. An integrated circuit comprising:
a plurality of I/O cells located in a bank of cells, each I/O cell of the plurality of I/O cells includes an I/O pad and each I/O cell of the plurality of I/O cells is one of a first type or of a second type, each I/O cell of the first type has an active circuitry physical layout as per a first active circuitry floor plan, each I/O cell of the first type includes an ESD trigger circuit for detecting an ESD event, wherein for each I/O cell of the first type, circuitry of the ESD trigger circuit is at a first designated area of the first active circuitry floor plan;

each I/O cell of the second type has an active circuitry physical layout as per a second active circuitry floor plan, each I/O cell of the second type includes an ESD clamp device for providing a discharge path for discharging current from an ESD event in response to a detection of an ESD event by an ESD trigger circuit of an I/O cell of the first type, each I/O cell of the second type does not include an ESD trigger circuit to which the ESD clamp device of the I/O cell is responsive, wherein for each I/O cell of the second type, the ESD clamp device occupies a second designated area of its active circuitry floor plan;

wherein a location of the first designated area in the first active circuitry floor plan is a location that corresponds to a location of the second designated area in the second active circuitry floor plan.

22. The integrated circuit of claim 1 wherein each of the plurality of I/O cells include an I/O pad.

* * * * *